(12) United States Patent
Chen

(10) Patent No.: US 7,030,015 B2
(45) Date of Patent: *Apr. 18, 2006

(54) METHOD FOR FORMING A TITANIUM NITRIDE LAYER

(75) Inventor: Ching-Hua Chen, Hsinchu (TW)

(73) Assignee: Powerchip Semiconductor Corp., Hsin-chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/941,939

(22) Filed: Sep. 16, 2004

(65) Prior Publication Data

US 2005/0053722 A1    Mar. 10, 2005

Related U.S. Application Data

(63) Continuation-in-part of application No. 10/408,070, filed on Apr. 4, 2003, now Pat. No. 6,893,963.

(30) Foreign Application Priority Data

Oct. 21, 2002    (TW) .............................. 91124248 A

(51) Int. Cl.
*H01L 21/44*    (2006.01)

(52) U.S. Cl. ...................................... 438/663; 257/306
(58) Field of Classification Search ........ 257/306–311, 257/758, 770; 438/256, 399, 648, 663, 683, 438/240
See application file for complete search history.

(56) References Cited

U.S. PATENT DOCUMENTS

2005/0089634 A1*    4/2005    Otsuki ................. 427/255.394

* cited by examiner

*Primary Examiner*—David Nelms
*Assistant Examiner*—Calvin Lee
(74) *Attorney, Agent, or Firm*—Birch, Stewart, Kolasch & Birch, LLP

(57) ABSTRACT

A method for forming a titanium nitride layer. A pre-heating step is performed, wherein a substrate is placed in a chamber comprising inert gas with a pre-heating pressure between 0.1~3 torr. A TiN deposition step is then performed, wherein the substrate is placed in a reactive gas at least comprising $NH_3$ and $TiCl_4$, and the first TiN deposition step has a reactive pressure of more than 5 torr and a reactive temperature of more than 500° C.

17 Claims, 5 Drawing Sheets

METHOD FOR FORMING A TITANIUM NITRIDE LAYER

CROSS-REFERENCE TO RELATED APPLICATION

This application is a continuation-in-part (CIP) of U.S. application Ser. No. 10/408,070 filed on Apr. 4, 2003, now U.S. Pat. No. 6,893,963, which is hereby incorporated by reference.

BACKGROUND

The invention relates to a method for fabricating semiconductor devices, and in particular to a method for forming a titanium nitride layer utilized in the fabrication of DRAM capacitors.

Dynamic Random Access Memory (DRAM) is a widely used integrated circuit. Currently, common DRAM cells comprise a transistor and a capacitor. As is known to those familiar with the art, a capacitor is used to store electric charges, which provide electronic information. The capacitor must contain a sufficiently large capacitance, so that loss of information is avoided and refresh frequency is reduced.

Highly integrated DRAM elements are fulfilled by capacitors having three dimensional structures. In terms of material, capacitors typically comprise metal-insulator-metal (MIM), or a metal-insulator-semiconductor (MIS). Capacitance can be increased by enlarging the surface area of a storage plate, increasing the dielectric constant of the dielectric layer, or reducing thickness of the dielectric layer. In the first method, capacitors with rugged surfaces, such as fin or tree shapes are provided. The third method is disadvantageous as the thickness of the dielectric layer is already very thin, and when thinned to less than 50 angstroms, direct tunneling is easily induced, causing excess leakage. Thus, much research has been directed into dielectric material with high dielectric constant to replace the commonly used silicon oxide. Tantalum pentoxide ($Ta_2O_5$) is a result, replacing $SiO_2$ or $Si_3N_4$ as a more ideal dielectric material due to its high dielectric constant of, about three times that of $Si_3N_4$, i.e. 22~25. Hence, the stored charges can be greatly increased and element performance is improved.

A typical stacked capacitor structure utilizing $Ta_2O_5$ as the dielectric layer is shown in FIG. 1, wherein 2 represents the MOS transistor, 10 represents a plug and lower electrode plate comprising conductive material, such as polysilicon or tungsten, 12 is the $Ta_2O_5$ capacitive dielectric layer, 14 is the upper electrode plate formed by TiN, and 16 is the inner dielectric layer. Although not shown in the figure, the capacitive dielectric layer 12 separates the upper electrode plate and the lower electrode plate. The upper electrode plate of TiN on the $Ta_2O_5$ capacitive dielectric layer is typically formed by chemical vapor deposition and annealing.

The uniform TiN film serving as the top electrode, however, is not easily formed by conventional CVD methods using $TiCl_4$ and $NH_3$ as precursors. Consequently, leakage is likely to occur at the thin portion of the top electrode if the TiN layer is non-uniform.

SUMMARY

Embodiments of the invention provide a method for forming a TiN layer. A pre-heating step is performed, wherein a substrate is put in a chamber comprising inert gas at a pre-heating pressure between 0.1~3 torr. A first TiN deposition step is then performed, wherein the substrate is placed in a first reactive gas at least comprising $NH_3$ and $TiCl_4$, and the first TiN deposition step has a first reactive pressure more than 5 torr and a first reactive temperature more than 500° C.

Embodiments of the invention provide an additional method for forming a TiN layer. A pre-heating step is performed at a pre-heating temperature between 0.1~3 torr, wherein a substrate is placed in a chamber comprising inert gas. A first TiN deposition step is performed, wherein the substrate is placed in a first reactive gas at least comprising $NH_3$ and $TiCl_4$ with a first reactive pressure of less than 1torr and a first reactive temperature of less than 500° C. A first annealing step is performed with a first annealing pressure between 1~3 torr. A second TiN deposition step is performed, wherein the substrate is placed in a second reactive gas at least comprising $NH_3$ and $TiCl_4$ with a second reactive pressure more than 5 torr and a second reactive temperature of more than 500° C. A second annealing step is performed with a second annealing pressure of more than 5 torr.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein.

DETAILED DESCRIPTION OF THE INVENTION

FIGS. 3A~3G are cross-sections of the method for forming a titanium nitride layer serving as the upper electrode plate of a $Ta_2O_5$ capacitive dielectric layer.

Figure 3A:
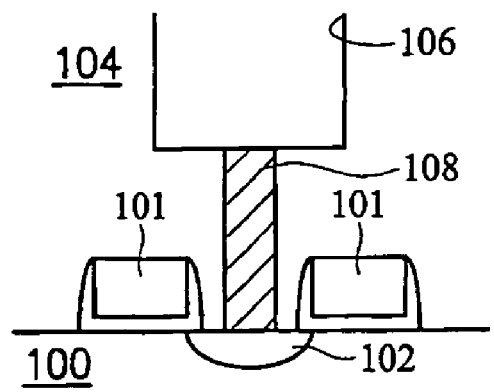
FIG. 3A~3G are cross-sections of an embodiment of the invention.

First, a semiconductor substrate 100, as shown in FIG. 3A, is provided. Two neighboring MOS transistors 101 are formed on the substrate 100, and an interlayer dielectric layer 104, such as an oxide layer is formed to cover the transistors 101. A source/drain contact region 102 is formed in the substrate between the two transistors 101, wherein a plug 108 is formed in the interlayer dielectric layer 104 to contact the region 102. The plug 108 comprises conductive material, such as polysilicon or tungsten. A predetermined capacitor area 106 is additionally formed in the interlayer dielectric layer 104.

Figure 3B:
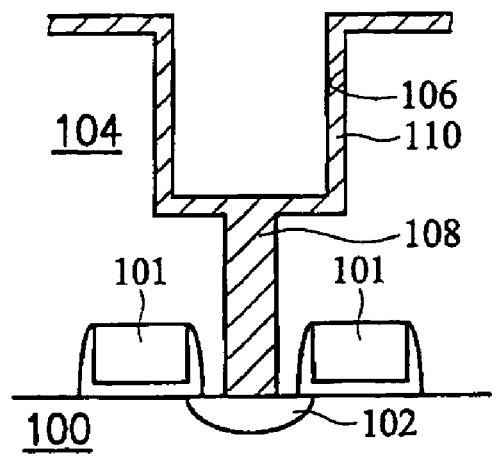
Figure 3C:
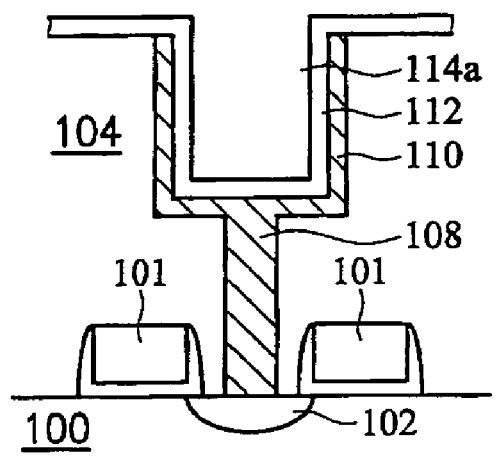

Next, as shown in FIG. 3B, a conductive layer 110 is formed conformally along the predetermined capacitor area 106 to serve as the lower electrode plate. Conductive material can be identical to the plug 108, such as polysilicon or tungsten. The conductive layer 110 around the predetermined capacitor area 106 is removed, and the conductive layer 110 on the sidewalls and bottom of the predetermined capacitor area 106 remains. Next, as shown in FIG. 3C, a capacitive dielectric layer 112 of $Ta_2O_5$ is formed along the predetermined capacitor area 106 and the conductive layer 110. Formation of the capacitive dielectric layer 112 is carried out in a low pressure chemical vapor deposition reactor, preferably with a temperature of 450° C., using $Ta(OC_2H_5)_5$ and oxygen as precursors. The carrier gas is preferably Argon or other suitable gases.

Figure 1:
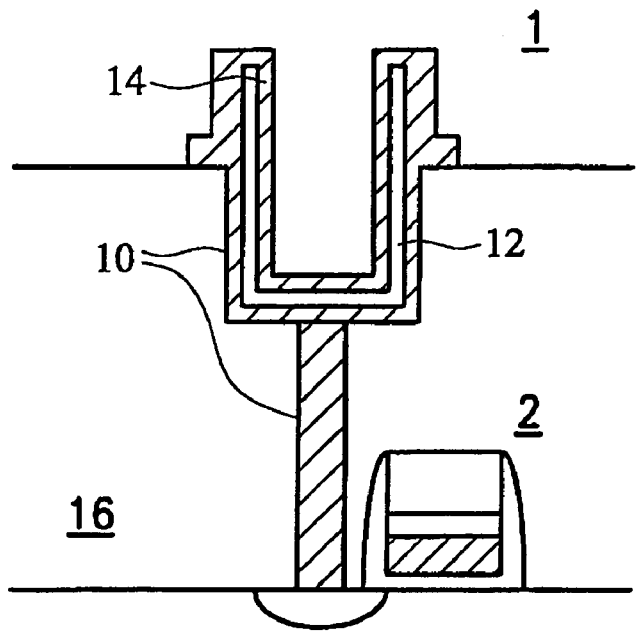
FIG. 1 illustrates a cross section of a conventional stacked capacitor.
Figure 2:
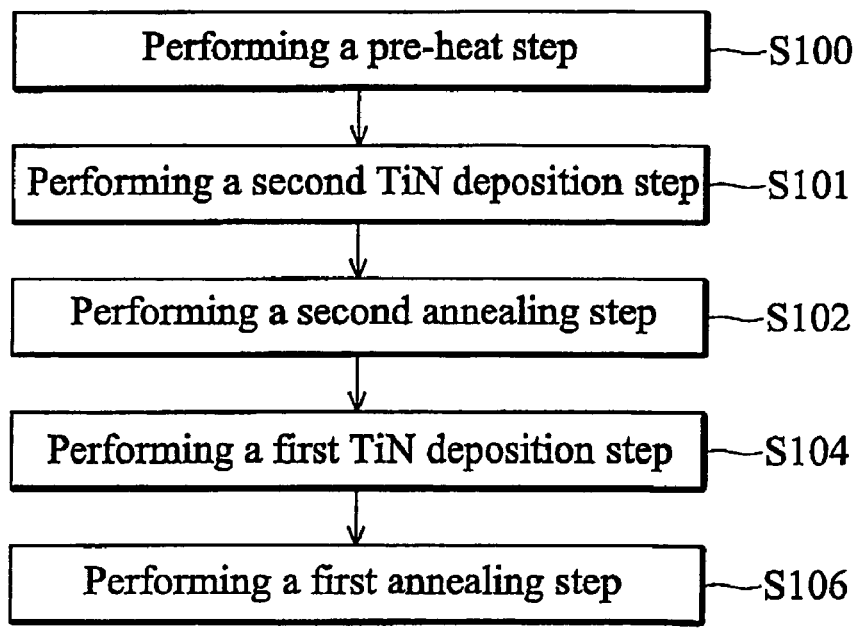
FIG. 2 is a flowchart showing the steps of the method for forming a titanium nitride layer of an embodiment of the invention.

Suitable semiconductor substrates are not limited to semiconductor substrates having the above structures, any substrate formed with a $Ta_2O_5$ capacitive dielectric layer that requires the formation of titanium nitride is applicable. FIG. 2 shows a flow chart of an embodiment of the invention. As shown in FIG. 2, a pre-heating step, a second deposition step, a second annealing step, a first deposition step and a first annealing step are performed.

Figure 4:
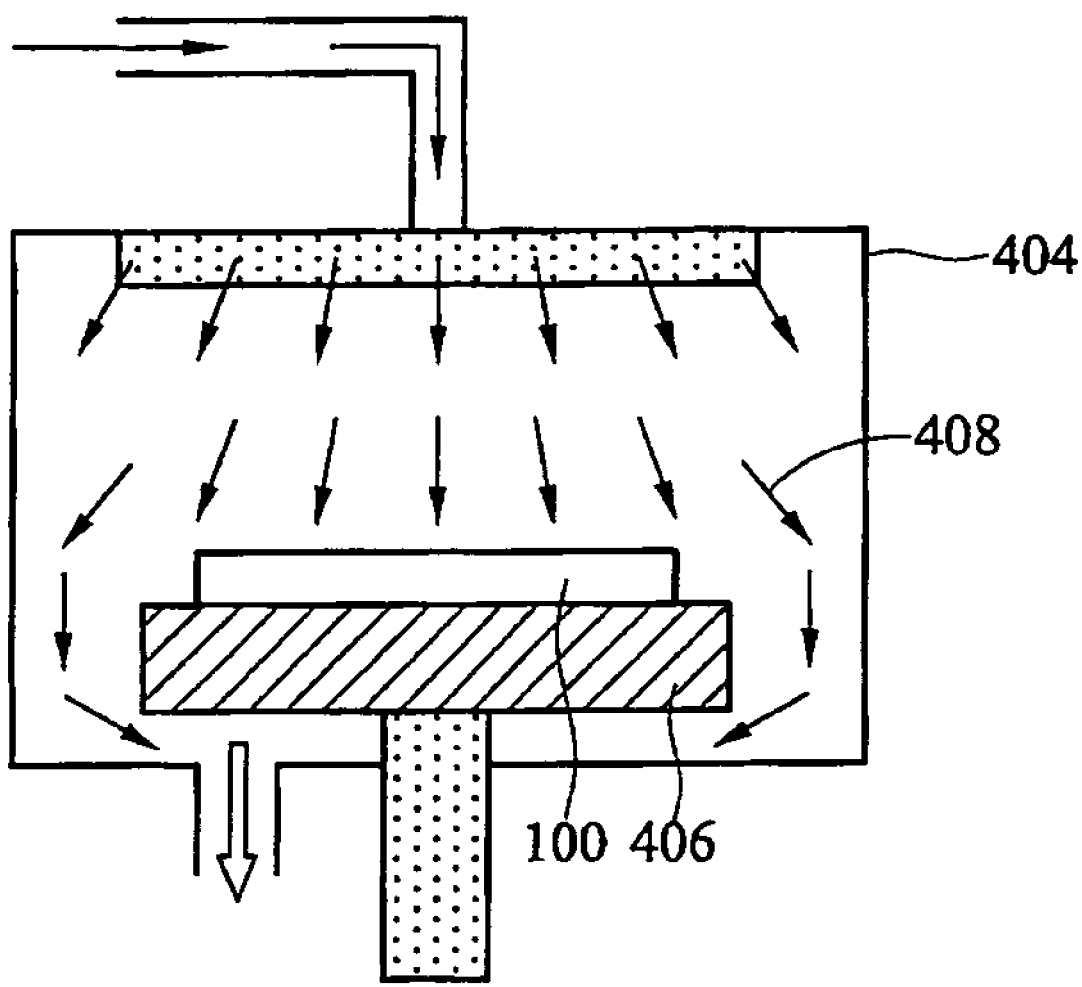
FIG. 4 shows an apparatus for forming the TiN film of an embodiment of the invention.

FIG. 4 shows an apparatus for forming the TiN film of an embodiment of the invention. Referring to FIG. 4, the pre-heating step (S100) is performed by placing a substrate 100 formed with a bottom electrode and a $Ta_2O_5$ capacitor dielectric layer into a chamber 404. Preferably, the pre-heating temperature is less than 500° C., and more preferably between 300° C.~500° C. When pre-heating, at least one inert gas 408, for example Ar or N2, is introduced into the chamber 404, and the chamber 404 maintains a low pressure of between 0.1 Torr to 3 Torr for example.

Figure 3D:
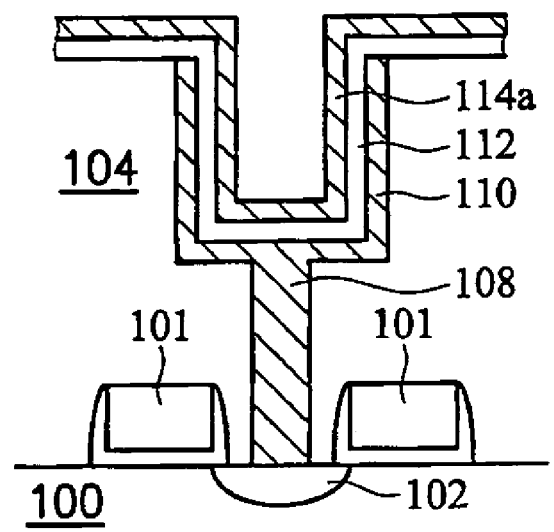

The chamber pressure is increased to perform a second deposition step subsequent to the pre-heating step. The semiconductor substrate 100 formed with a $Ta_2O_5$ capacitive dielectric layer is exposed to a reactive gas comprising $TiCl_4$ and $NH_3$ in a second deposition step (S101) to form a titanium nitride layer 114a on the $Ta_2O_5$ capacitive dielectric layer 112, as shown in FIG. 3D. Preferably the flow ratio of $NH_3/TiCl_4$ is more than 1, and more preferably 3~10. The reaction pressure is preferably less than 1 torr, and the reaction temperature can be the same as that of the pre-heating step, and is preferably less than 500° C. The thickness of the titanium nitride layer 114a is preferably at least 30 angstroms, and the $NH_3$ flow rate is preferably 40~60 sccm. During this second deposition step, the $TiCl_4$ flow rate is kept low to form titanium nitride slowly (preferably between 30~80 angstroms/min). The chlorine concentration is thus kept minimal, so that resistance to formation of the titanium nitride formed is reduced. Additionally, usage of a low $TiCl_4$ flow rate can potentially prevents formation of $TiO_2$, thereby reducing the possibility of $TiO_2$ causing leakage.

Figure 3E:
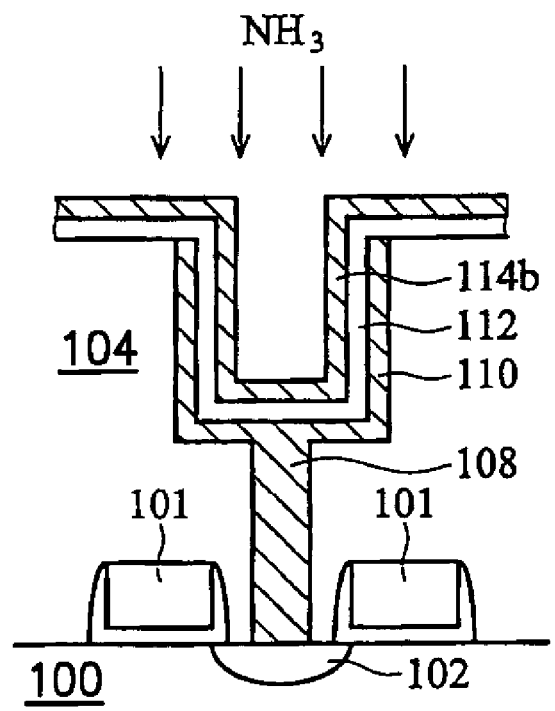

The titanium nitride layer 114a is then subjected to a second annealing step (S102) in a reactor filled with $NH_3$ gas, thus forming a titanium nitride layer 114b as shown in FIG. 3E. Pressure is preferably between 1 and 3 torr, and the flow rate of $NH_3$ preferably exceeds 1000 sccm. The second annealing step is carried out in an $NH_3$ environment. As a result, Cl ions in the titanium nitride layer are replaced by N atoms in $NH_3$, thus producing a more dense titanium nitride layer.

Figure 3F:
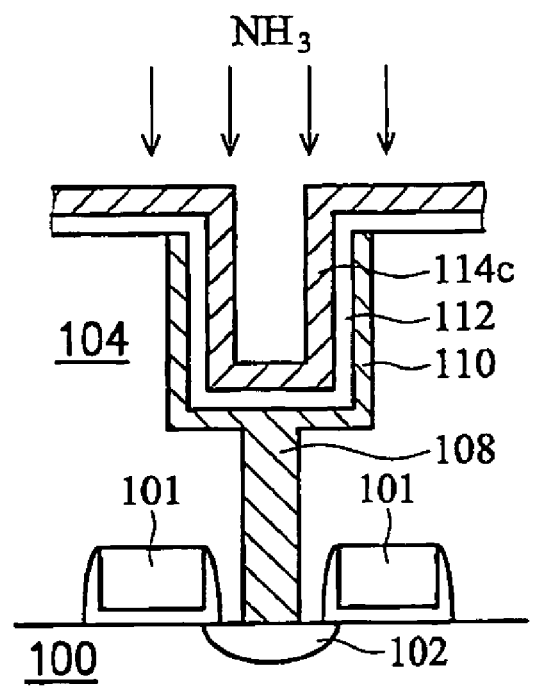

A first deposition step (S104) is performed, wherein the substrate 100 is subjected to a reactive gas comprising $TiCl_4$ and $NH_3$ for (S104). The pressure preferably exceeds 5 torr, with 10 torr as the maximum acceptable value. Flow ratio of $NH_3/TiCl_4$ preferably exceeds 1 and more preferably 5 with temperature of the substrate preferably between 500 and 600° C. When pressure exceeds 5 torr, the amount of gas increases, reducing heat, causing the heater below the substrate to detect the change, such that the substrate is heated to between 500 and 600° C. A higher flow rate of $TiCl_4$ is used for more rapid deposition in the first deposition step. Preferably flow rate for $TiCl_4$ is at least 25 sccm, with a preferable deposition rate from 100 to 500 angstroms/min. With these parameters, resistance of the titanium nitride layer is reduced. The titanium nitride layer 114c formed is as shown in FIG. 3F, at thickness of preferably at least 60 angstroms.

Figure 3G:
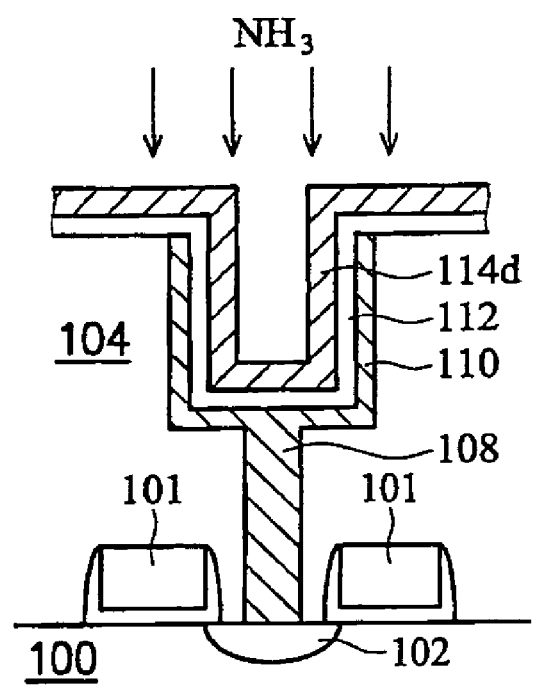

The substrate is then subjected to annealing in a first annealing step (S106) in $NH_3$ gas for nitridation with a preferable pressure exceeding 5 torr, and less than 10 torr. This high temperature process causes the titanium nitride layer to be more dense. Stress within the titanium nitride layer is thus released, forming a titanium nitride layer 114d having excellent quality, as shown in FIG. 3G.

FIG. 4, the pre-heating step (S100) performed at low pressure (rather than high pressure, for example more than 5 torr) is performed in. Due to the low pre-heating pressure of this embodiment of the invention, loss of the substrate 100 heat caused by the temperature difference between the substrate 100 and the inert gas 408 is eliminated, thus reducing the frequency of power increases by heater 406 under the substrate 100. Consequently, power deviation of the heater 406 is reduced, and the surface of substrate 100 is kept in a more stable state. Accordingly, the TiN film with uniform thickness and density can be accomplished. Moreover, resistance of the TiN film formed by methods of embodiments of the invention can be decreased, and the capacitor using the TiN film as a top electrode on a capacitor dielectric layer, for example $Ta_2O_5$, has a lower leakage current.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a titanium nitride layer, comprising:
    pre-heating a substrate, wherein the substrate is placed in an inert gas ambiance at a pre-heating pressure between 0.1~3 torr; and
    depositing a first TiN layer overlying the substrate, wherein the substrate is placed in a first reactive gas at least comprising $NH_3$ and $TiCl_4$ at a first reactive pressure of more than 5 torr and a first reactive temperature of more than 500° C.

2. The method as claimed in claim 1, further comprising performing an annealing operation subsequent depositing the first TiN layer on the substrate, and the annealing operation is performed with the substrate disposed in $NH_3$.

3. The method as claimed in claim 2, wherein the annealing operation comprises an annealing pressure of more than 5 torr.

4. The method as claimed in claim 1, wherein the $NH_3/TiCl_4$ ratio of the first reactive gas is more than 1.

5. The method as claimed in claims 1, further comprising, before depositing the first TiN layer overlying the substrate:
    depositing a second TiN layer overlying the substrate, wherein the substrate is exposed to a second reactive gas at least comprising $NH_3$ and $TiCl_4$ with a second reactive pressure less than 1 torr and a second reactive temperature less than 500° C.

6. The method as claimed in claim 5, further comprising, after depositing the second TiN layer and before depositing the first TiN layer:
performing an annealing operation in a $NH_3$ gas.

7. The method as claimed in claim 6, wherein the annealing operation is with an annealing pressure between 1~3 torr.

8. The method as claimed in claim 5, wherein the $NH_3$/$TiCl_4$ ratio of the second reactive gas is 3~10.

9. The method as claimed in claim 1, wherein the substrate comprises a bottom electrode of a capacitor and a dielectric layer disposed thereon, and the titanium nitride layer is formed on the dielectric layer.

10. The method as claimed in claim 1, wherein the inert gas is N2 or Ar.

11. The method as claimed in claim 1, wherein the pre-heating operation is carried out at a pre-heating temperature between 300~500° C.

12. The method as claimed in claim 1, wherein the pre-heating temperature is the same as the first reactive temperature of depositing the first TiN layer.

13. A method for forming a titanium nitride layer, comprising:
pre-heating a substrate, wherein the substrate is placed in an inert gas ambiance at a pre-heating pressure between 0.1~3 torr;
depositing a first TiN layer on the substrate, wherein the substrate is placed in a first reactive gas at least comprising $NH_3$ and $TiCl_4$ with a first reactive pressure less than 1 torr and a first reactive temperature less than 500° C.;
performing first annealing operation with a first annealing pressure of between 1~3 torr;
depositing a second TiN layer on the first TiN layer, wherein the substrate is placed in a second reactive gas at least comprising $NH_3$ and $TiCl_4$ with a second reactive pressure of more than 5 torr and a second reactive temperature of more than 500° C.; and
performing a second annealing operation with a second annealing pressure more than 5 torr.

14. The method as claimed in claim 13, wherein the first annealing operation and the second annealing operation are performed in a $NH_3$ gas ambiance.

15. The method as claimed in claim 13, wherein $NH_3$/$TiCl_4$ ratio of the first reactive gas is 3~10, and $NH_3$/$TiCl_4$ ratio of the second reactive gas is more than 1.

16. The method as claimed in claim 13, wherein the inert gas is N2 or Ar.

17. The method as claimed in claim 13, wherein the pre-heating operation is performed at a pre-heating temperature between 300~500° C.

* * * * *